(12) United States Patent
Iketani et al.

(10) Patent No.: US 12,063,748 B2
(45) Date of Patent: Aug. 13, 2024

(54) CATALYZED METAL FOIL AND USES THEREOF TO PRODUCE ELECTRICAL CIRCUITS

(71) Applicant: AVERATEK CORPORATION, Santa Clara, CA (US)

(72) Inventors: Shinichi Iketani, Sunnyvale, CA (US); Sunity K Sharma, Fremont, CA (US); Gary Lawrence Borges, San Jose, CA (US); Michael Riley Vinson, Sunnyvale, CA (US)

(73) Assignee: Averatek Corporation, Santa Clara, CA (US)

( * ) Notice: Subject to any disclaimer, the term of this patent is extended or adjusted under 35 U.S.C. 154(b) by 627 days.

(21) Appl. No.: 17/174,759

(22) Filed: Feb. 12, 2021

(65) Prior Publication Data

US 2021/0259112 A1 Aug. 19, 2021

Related U.S. Application Data

(60) Provisional application No. 62/976,110, filed on Feb. 13, 2020, provisional application No. 63/066,508, (Continued)

(51) Int. Cl.
*H05K 3/18* (2006.01)
*C23C 18/16* (2006.01)
(Continued)

(52) U.S. Cl.
CPC ......... *H05K 3/181* (2013.01); *C23C 18/1605* (2013.01); *C23F 17/00* (2013.01);
(Continued)

(58) Field of Classification Search
CPC .... H05K 3/4652; H05K 3/0041; H05K 3/062; H05K 3/185; H05K 2201/0358;
(Continued)

(56) References Cited

U.S. PATENT DOCUMENTS

| 4,006,047 A | 2/1977 | Brummett et al. |
| 5,827,577 A | 10/1998 | Spencer |

(Continued)

FOREIGN PATENT DOCUMENTS

| CA | 1209026 | 1/1986 |
| JP | 1991225994 A | 8/1992 |

(Continued)

OTHER PUBLICATIONS

WO2015056880 Method for Manufacturing Circuit Board.

*Primary Examiner* — Jeffrey T Carley
*Assistant Examiner* — Jose K Abraham
(74) *Attorney, Agent, or Firm* — Fish IP Law, LLP

(57) ABSTRACT

Systems, methods, and devices related to catalyzed metal foils are disclosed. Contemplated metal foils have a bottom surface, preferably roughened to Ra of at least 0.1 μm, bearing a catalyst material. The metal foils are etchable, typically of aluminum or derivative thereof, and is less than 500 μm thick. Methods and systems for forming circuits from catalyzed metal foils are also disclosed. The catalyst material bearing surface of the metal foil is applied to a substrate and laminated, in some embodiments with a thermoset resin or thermoplastic resin therebetween or an organic material first coating the catalytic material. The metal foil is removed to expose the catalyst material, and a conductor is plated to the catalyst material.

14 Claims, 13 Drawing Sheets

Related U.S. Application Data filed on Aug. 17, 2020, provisional application No. 63/119,950, filed on Dec. 1, 2020.

(51) Int. Cl.
*C23F 17/00* (2006.01)
*H05K 3/28* (2006.01)
*H05K 3/46* (2006.01)

(52) U.S. Cl.
CPC .......... H05K 3/285 (2013.01); H05K 3/4644 (2013.01); *H05K 2203/0307* (2013.01)

(58) Field of Classification Search
CPC ... H05K 2203/0323; H05K 2203/0376; H05K 2203/0582; H05K 2203/06; H05K 2203/0709
See application file for complete search history.

(56) References Cited

U.S. PATENT DOCUMENTS

| | | | | |
|---|---|---|---|---|
| 6,119,335 A * | 9/2000 | Park | .................... | H05K 3/4652 29/830 |
| 6,120,693 A * | 9/2000 | Petti | .................... | H05K 3/4652 430/318 |
| 6,255,039 B1 * | 7/2001 | Xu | ........................ | H05K 3/4652 430/318 |
| 6,405,431 B1 * | 6/2002 | Shin | .................... | H05K 3/4652 29/830 |
| 6,893,681 B2 * | 5/2005 | Cooray | ............... | C23C 18/2086 427/407.1 |
| 7,740,936 B2 | 6/2010 | Ogawa et al. | | |
| 2002/0117400 A1 | 8/2002 | Hotta | | |
| 2003/0090345 A1 * | 5/2003 | Cooray | .................. | H05K 3/181 333/239 |
| 2003/0143411 A1 * | 7/2003 | Nakagawa | .......... | C23C 18/1658 428/458 |
| 2004/0231141 A1 * | 11/2004 | Nishinaka | .............. | H05K 3/108 29/830 |
| 2012/0241082 A1 | 9/2012 | Chen | | |
| 2013/0180773 A1 | 7/2013 | Chiang | | |
| 2016/0057867 A1 * | 2/2016 | Yamauchi | .............. | H05K 3/027 427/535 |
| 2016/0157344 A1 * | 6/2016 | Wang | .................... | H05K 3/182 174/257 |
| 2019/0394888 A1 | 12/2019 | Itekani | | |

FOREIGN PATENT DOCUMENTS

| | | | |
|---|---|---|---|
| KR | 20030027117 A | * | 4/2003 |
| KR | 20170039382 A | * | 4/2017 |

* cited by examiner

CATALYZED METAL FOIL AND USES THEREOF TO PRODUCE ELECTRICAL CIRCUITS

This application claims the benefit of priority to U.S. Provisional Patent No. 63/119,950 filed Dec. 1, 2020, which in turn claims the benefit of priority to U.S. Provisional Patent No. 63/066,508 filed Aug. 17, 2020, which in turn claims the benefit of priority to U.S. Provisional Patent No. 62/976,110, filed Feb. 13, 2020, each of which is incorporated by reference in its entirety herein.

FIELD OF THE INVENTION

The field of the invention relates to methods and systems for manufacturing conductive patterns.

BACKGROUND

The following description includes information that may be useful in understanding the present invention. It is not an admission that any of the information provided herein is prior art or relevant to the presently claimed invention, or that any publication specifically or implicitly referenced is prior art.

As competition in manufacturing electric circuits continues to drive profit margins down, improvements must be made in the simplicity, efficiency, and cost effectiveness of manufacturing protocols in order to maintain a competitive edge in the market. For example, U.S. Pat. No. 4,006,047 to Brummett et al ("Brummett") teaches using a mylar film soaked in an electroless plating catalyst solution to thermally transfer the catalyst onto a substrate for electroless deposition. However, shipping pre-soaked mylar films creates issues of the mylar material decomposing over time and further shelf-stable, shipping, and durability issues. Also mylar has low melting and decomposition temperature and it does not withstand the original shape under 150° C. or higher temperature. This limits this material and technique usage for the thermoplastic materials which usually have cure temperature of 150° C. or higher. Further, requiring a user to soak the mylar in catalyst solution is unnecessarily complicated, limiting the market user base for the product.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Partially addressing durability, U.S. Pat. No. 7,740,936 to Ogawa et al ("Ogawa") teaches applying nuclei of electroless plating catalyst to a metal foil, which improves durability of the product. However, Ogawa does not teach using such foils to transfer catalyst to substrates for plating, for example using the metal foil as a sacrificial transfer medium.

Thus, there is still a need for improved methods and systems and devices for simply, efficiently, and cheaply patterning catalyst onto substrates to form electric circuits, and methods of manufacturing such circuits therefrom.

SUMMARY OF THE INVENTION

The inventive subject matter provides systems, methods, and devices related to catalyzed metal foils, as well as uses thereof and devices therefrom. A metal foil has a bottom surface with a catalyst material disposed on at least part of the bottom surface of the metal foil, with that part of the bottom surface typically roughened, for example via etching or dendrite growth, or in some embodiments oxidized, or combinations thereof. The metal foil is etchable or otherwise removable, and is preferably one of aluminum, anodized aluminum, copper, tin, or alloys thereof. The metal foil is preferably less than 500 μm thick, for example less than 400 μm, 300 μm, 200 μm, 100 μm, 80 μm, 60 μm, 50 μm, or less than 10 μm thick. In some embodiments, a part of the bottom surface (e.g., the roughened by dendrite growth portion, roughened by etching portion, etc.) has an arithmetic average roughness (Ra) of at least 0.1 μm, 0.15 μm, 0.2 μm, 0.25 μm, 0.3 μm, 0.35 μm, 0.4 μm, 0.45 μm, or at least 0.5 μm.

The catalyst material includes a catalyst precursor for at least one of Ag, Au, Pt, Pd, Cu, Ni, Co or Rh in some embodiments. Alternatively, or in combination, the catalyst material includes at least one of catalytic Ag, Au, Pt, Pd, Cu, Ni, Co or Rh. The catalytic material is typically disposed as an ink utilizing an organometal precursor such as organometal compound (e.g., as metal ink, reduced metal ink, thermally reduced metal ink, etc.) as a layer with a thickness of between the atomic radius of a component of the catalytic material (e.g., catalytic metal, Ag, Au, Pt, Pd, Cu, Ni Co or Rh, etc.) and 500 μm. The organometal compound can be stabilized by chelating or interacting of counter anions. Alternatively, or in combination, the catalytic material is disposed (e.g., metal ink, reduced metal ink, chemically reduced metal ink, etc.) as a plurality of particles with an average radius of between the atomic radius of a component of the catalytic material (e.g., catalytic metal, Ag, Au, Pt, Pd, Cu, Ni, Co, or Rh, etc.) and 100 nm. In some embodiments, the ink includes some metal particles (of one or more metals) that provide for relatively thicker applications of ink or catalyst precursor, for example by avoiding unstable catalyst precursor conditions due to high concentration of precursor in the ink.

The catalyst layer may also be deposited by sputtering, by evaporation, or chemical vapor deposition.

The inventive subject matter further contemplates systems and methods of forming electrical circuits, as well as circuits formed therefrom. Methods of forming an electrical circuit are contemplated using a metal foil with a surface having a catalyst material. The surface of the metal foil with the catalyst material is applied to a surface of a substrate, and the metal foil is laminated to the substrate. The metal foil (preferably etchable or removable metal foil) is then removed (e.g., etched, etc.), exposing the catalyst material on the surface of the substrate. A first conductor is then electroless metal plated to the exposed catalyst material. Further conductors can be plated (e.g., electrolytic plating) and additional metal foils can be laminated to the conductors and etched as required by an electrical circuit pattern. Metal foils including such layers, and as described below, are of the inventive subject matter.

In some embodiments, the surface of the metal foil with the catalyst material is coated by a coating layer of either a B-stage (curable) thermoset resin (e.g., epoxy resin, polyimide precursor, urethane resin, acrylic resin) or a thermoplastic material, or a combination thereof, which is referred to herein as Resin Coated Catalyzed Foil (RCCF™). In some embodiments, the coating layer is a laminate material (e.g., conventional resins used for laminate such as epoxy resin for FR4, conventional resins used for resin coated foils (RCF) such as R-FR10 (Panasonic) and conventional resins used for bonding film such as ABF (Ajinomoto fine techno)) The resin coated metal foil is then laminated to the substrate, with the coating layer adjacent to the substrate. The metal foil (preferably etchable or removable metal foil) is then removed (e.g., etched, etc.), exposing the catalyst material on the surface of the coating layer (e.g., where coating layer is B-stage resin, lamination cures it to C-stage resin, etc.). A first conductor is then electroless metal plated to the exposed catalyst material. Further conductors can be plated (e.g., via electrolytic plating) and additional metal foils can be laminated to the conductors and etched as required by an electrical circuit pattern.

In some embodiments, the catalyst material is (i) a catalyst precursor for at least one of Ag, Au, Pt, Pd, Cu, Ni, Co, or Rh, or (ii) at least one of catalytic Ag, Au, Pt, Pd, Cu, Ni, Co, or Rh, or combinations thereof. In some methods using a catalyst precursor, the catalyst precursor is reduced (e.g., thermal reduction, chemical reduction, etc.) to a catalyst before the step of applying the surface of the metal foil to the surface of the substrate, in some embodiments after the metal foil has been etched. The metal foil is typically made of one of aluminum, anodized aluminum, copper, tin, and alloys thereof. In some embodiments, an adhesive layer is applied between the surface of the metal foil having the catalyst material to the surface of the substrate.

In some embodiments a pre-ceramic polymer, a ceramic or a composite of metal oxides, polymers or oxidized metal particles, nitrides borides, etc., is coated on a surface the metal foil or on a surface of the catalyst layer, or both. A coating layer can further coat the layer deposited on the catalyst material, not to exceed 500 µm, 100 µm, 10 µm, or 1 µm thick. The thickness depends on the coating material.

A layer of an organic material can further be disposed on the catalyst material layer no more than 10 µm, 5 µm, 1 µm, 0.5 µm, or 0.1 µm thick. The catalyst material layer is preferably no more than 500 nm, 100 nm, 50 nm, or 20 nm thick. The organic material is preferably a copolymer with an alkaline-reactive polymer portion and an alkaline-non-reactive polymer portion. In preferred embodiments the copolymer further includes a functional group with a lone pair electron, or otherwise includes at least one of nitrogen or sulfur. Preferred alkaline-reactive polymer portions have at least one polyimide, amide, ester, or thioester. Generally, the copolymer has a composition of alkaline-reactive polymer portion to alkaline-non-reactive polymer portion of between 5%:95% and 95%:5% by molecular weight, respectively.

The organic material is preferably selected to protect the catalyst material from diffusion of the catalyst material (e.g., during thermal process, lamination, etc.), or otherwise displacement or damage to the catalyst material or its catalytic activity. In some embodiments the organic material is selected to improve bonding strength of the catalyst material to a substrate or absorb mechanical stress between the catalyst layer and a substrate due to temperature change. The organic material is selected to have at least 25%, 50%, 75%, or 100% greater adhesion (e.g., mechanical, chemical, dispersive, diffusive, electrostatic, etc.) to a substrate than the catalyst material has to the substrate.

Methods can further include a step of applying a plating resist in a negative circuit pattern onto the exposed catalyst material before the step of electroless metal plating. The plating resist is then preferably removed (e.g., etched, etc.) after the step of electroless metal plating. It is also contemplated that, before the step of electroless metal plating, an etching resist is applied in a positive circuit pattern onto the exposed catalyst material. The catalyst material not covered by the etching resist is then removed (e.g., etched, etc.), with the etching resist preferably removed thereafter. In some embodiments, a plating resist is further applied over the first conductor in a negative circuit pattern, and a second conductor is electrolytically deposited to exposed portions of the first conductor. The plating resist is preferably removed, and portions of the first conductor not covered by the second conductor are further removed.

In some embodiments, a permanent plating resist is further applied in a negative circuit pattern onto the exposed catalyst material, before the step of electroless metal plating. After electroless plating, it is contemplated that a second conductor is electrolytically deposited to the first conductor, and an etching resist is applied over the second conductor in a positive circuit pattern. The first and second conductor not covered by the etching resist are preferably removed, as is the etching resist.

In some embodiments, a metal is plated to a surface of the substrate. An etching resist layer is further applied in a pattern of a circuit, or at least part of the pattern of a circuit, onto the metal plated surface. The metal not covered by the etching resist layer is etched from the surface. The etching resist is then removed from the surface, leaving plated metal in the shape of the pattern or part of the pattern.

Systems and methods for producing a metal foil are further contemplated. A portion of a metal foil is coated with a catalyst ink, with the catalyst ink coating having a precursor dissolved in a solvent. The catalyst ink coating is then dried on the metal foil, followed by reducing (e.g., thermal reduction, chemical reduction, etc.) the catalyst precursor to deposit a catalyst (e.g., active, etc.) on the portion of the metal foil, which is preferably etchable or otherwise removable. The metal foil is typically one of aluminum, anodized aluminum, copper, tin, or alloys thereof, and is preferably less than 500 µm thick, for example less than 200 µm, 100 µm, 80 µm, 50 µm, 30 µm, 20 µm, or less than 10 µm thick. In some embodiments, the portion of the metal foil coated by catalyst ink is roughened, for example by etching or dendrite growth, or oxidized, or combinations thereof. Alternatively or in combination, that portion of the metal foil has an Ra of at least 0.1 µm, 0.15 µm, 0.2 µm, 0.25 µm, 0.3 µm, 0.35 µm, 0.4 µm, 0.45 µm, or at least 0.5 µm. In some embodiments the precursor ink includes metal particles, or one or more metals.

The catalyst is typically at least one of Ag, Au, Pt, Pd, Cu, Ni, Co, or Rh, and is optionally disposed as a layer with a thickness of between the atomic radius of a component of the catalyst (e.g., catalytic metal, Ag, Au, Pt, Pd, Cu, Ni, Co, or Rh, etc.) and 500 µm. Alternatively or in combination, the catalyst is disposed as a plurality of particles with an average radius of between the atomic radius of a component of the catalyst and 100 nm. The catalyst ink is typically coated to the metal foil by at least one of dip coating, roller coating, spray coating, spinner coating, bar coating, curtain coating, blade coating, air knife coating, cast coating, screen printing, gravure printing, offset printing, flexography printing, inkjet printing or combinations thereof. In some embodiments, the portion of the metal foil coated by metal ink is one complete surface (e.g., one complete side) of the metal foil.

Various objects, features, aspects and advantages of the inventive subject matter will become more apparent from the following detailed description of preferred embodiments, along with the accompanying drawing figures in which like numerals represent like components.

DETAILED DESCRIPTION

The inventive subject matter provides systems, methods, and devices related to catalyzed metal foils, as well as using such foils to form electrical circuits and the circuits formed therefrom.

Figure 1:
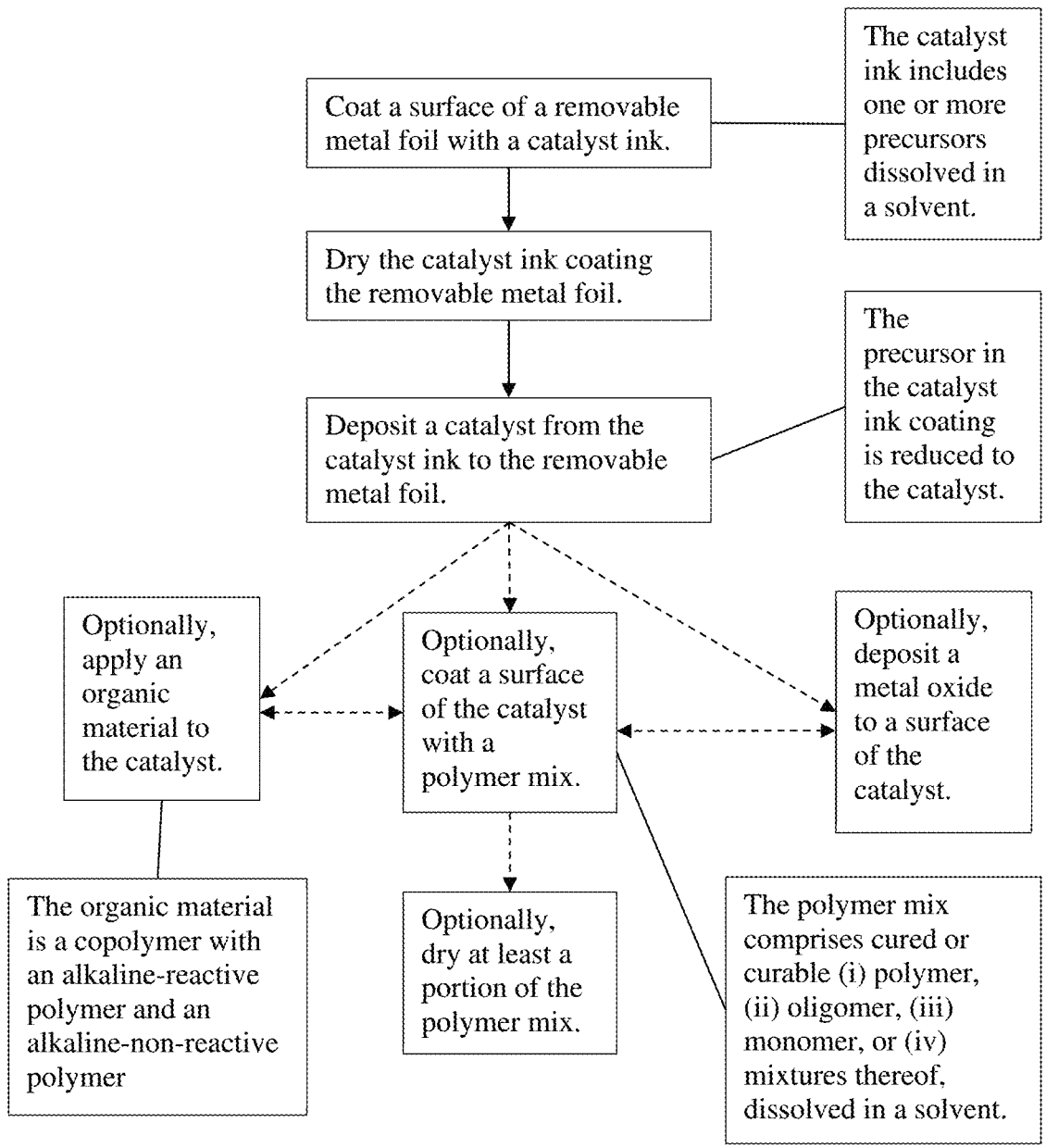
FIG. 1 depicts a flow chart for producing a catalyzed metal foil of the inventive subject matter.

FIG. 1 depicts a flow chart for producing a catalyzed metal foil of the inventive subject matter.

Figure 2A:
FIG. 2A depicts a catalyzed metal foil of the inventive subject matter.

FIG. 2A depicts catalyzed metal foil 200A of the inventive subject matter. Catalyzed metal foil 200 includes metal foil 210, which is etchable or removable and typically one of aluminum, anodized aluminum, copper, tin, or alloys thereof, has surface 212. Catalyst 220 is deposited onto surface 212, typically by coating surface 212 with a catalyst ink having a precursor for catalyst 220 and reducing the catalyst ink to deposit catalyst 220 onto surface 212. Surface 212 is preferably roughened, for example having an Ra of at least 0.1 µm, 0.15 µm, 0.2 µm, 0.25 µm, 0.3 µm, 0.35 µm, 0.4 µm, 0.45 µm, or at least 0.5 µm. In some embodiments, optional layer 230A can be further coated over catalyst 220 (or, before reduction, over the catalyst ink, etc.). Optional layer can be one or more polymers as described herein, or can be a pre-ceramic polymer, a ceramic or a composite of metal oxides, polymers, oxidized metal particles, nitrides or borides (e.g., titanium dioxide, zirconium dioxide, cerium dioxide, Yttrium oxide, or composites of these with per-ceramic polymers, epoxies that may be A staged, B staged or C staged). In some embodiments that include optional layer 230A, for example where optional layer 230A includes one or more pre-ceramic polymer, a ceramic or a composite of metal oxides, a further optional layer 240 can be further coated over optional layer 230A. In such embodiments, further optional layer 240 typically includes one or more polymers.

Figure 2B:
FIG. 2B depicts another catalyzed metal foil of the inventive subject matter.

FIG. 2B depicts an embodiment of catalyzed metal foil 200A, labeled 200B, where the optional layer is organic material layer 230B. Organic material 230B is a copolymer including an alkaline-reactive polymer and an alkaline-non-reactive polymer, and is typically no more than 1 µm to 0.1 µm thick. In some embodiments the copolymer further includes a functional group with a lone pair electron, for example nitrogen or sulfur. Preferred alkaline-reactive polymers have at least one polyimide, amide, ester, or thioester. Generally, the copolymer has a composition of alkaline-reactive polymer to alkaline-non-reactive polymer of between 5%:95% and 95%:5% by molecular weight, respectively.

Figure 3A:
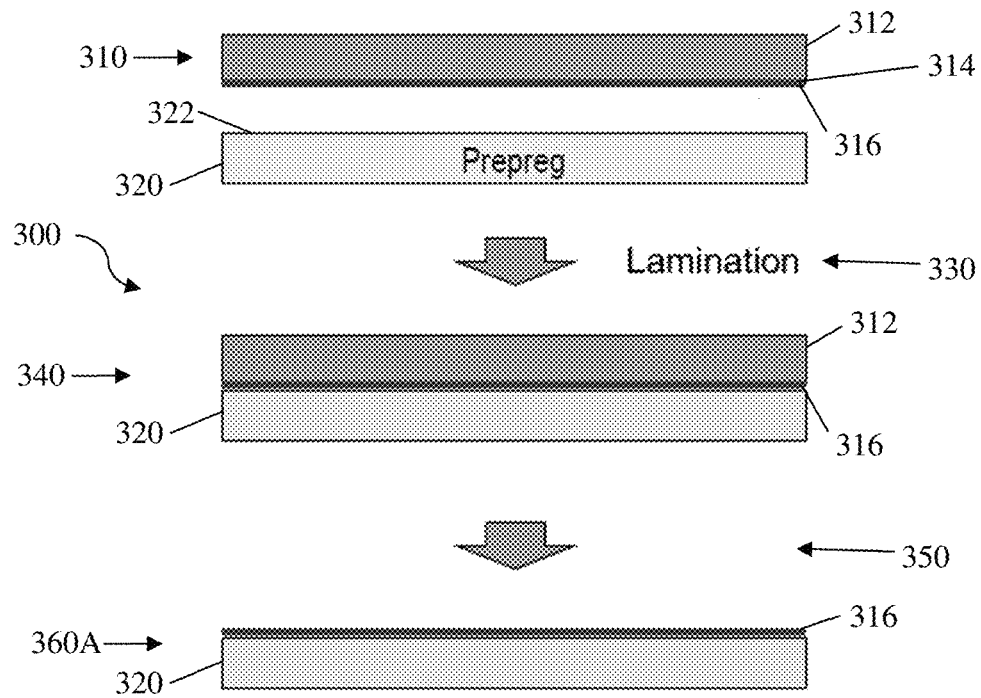
FIG. 3A depicts steps of a method of the inventive subject matter.
Figure 3B:
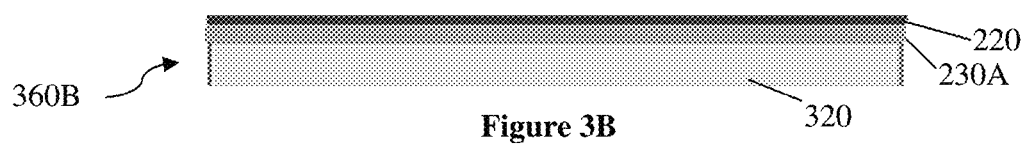
FIGS. 3B to 3D depict further steps in the method of FIG. 3A.
Figure 3C:
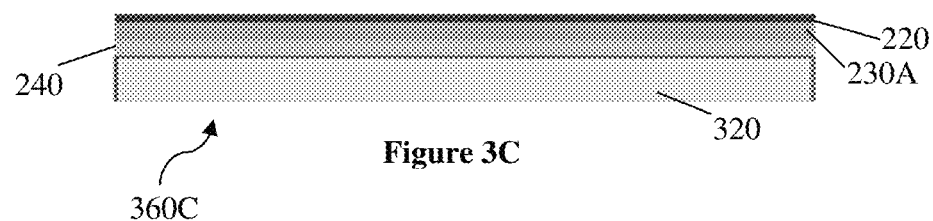
Figure 3D:
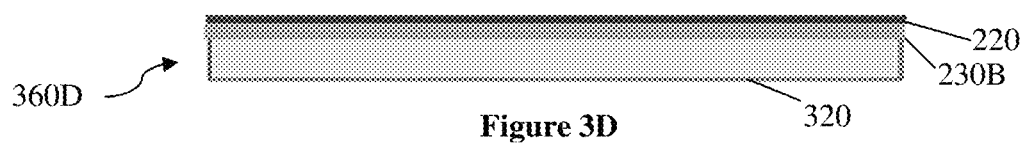

FIG. 3A depicts method 300 for manufacturing catalyzed substrate 360A using catalyzed metal foil 310. In step 330, surface 314 (having catalyst 316) of catalyzed metal foil 310 is laminated to surface 322 of substrate 320 (e.g., prepreg, curable film, thermoplastic substrate), producing interim material 340. In step 350, removable metal foil 312 is removed (e.g., etched, etc.) from interim material 340, forming catalyzed substrate 360A having catalyst 316 deposited onto substrate 320. In some embodiments, catalyzed metal foil 200A can be used in place of catalyzed metal foil 310, for example including optional layer 230A or further optional layer 240 as described. In such embodiments, catalyzed metal foil 360A will appear as catalyzed metal foil 360B including optional layer 230A as depicted in FIG. 3B, or catalyzed metal foil 360C including optional layer 230A and further optional layer 240 as depicted in FIG. 3C. In the embodiment of FIG. 3D, catalyzed metal foil 200B is used in place of catalyzed metal foil 310, including catalyzed metal foil 360D with organic material layer 230B as previously described.

Figure 4A:
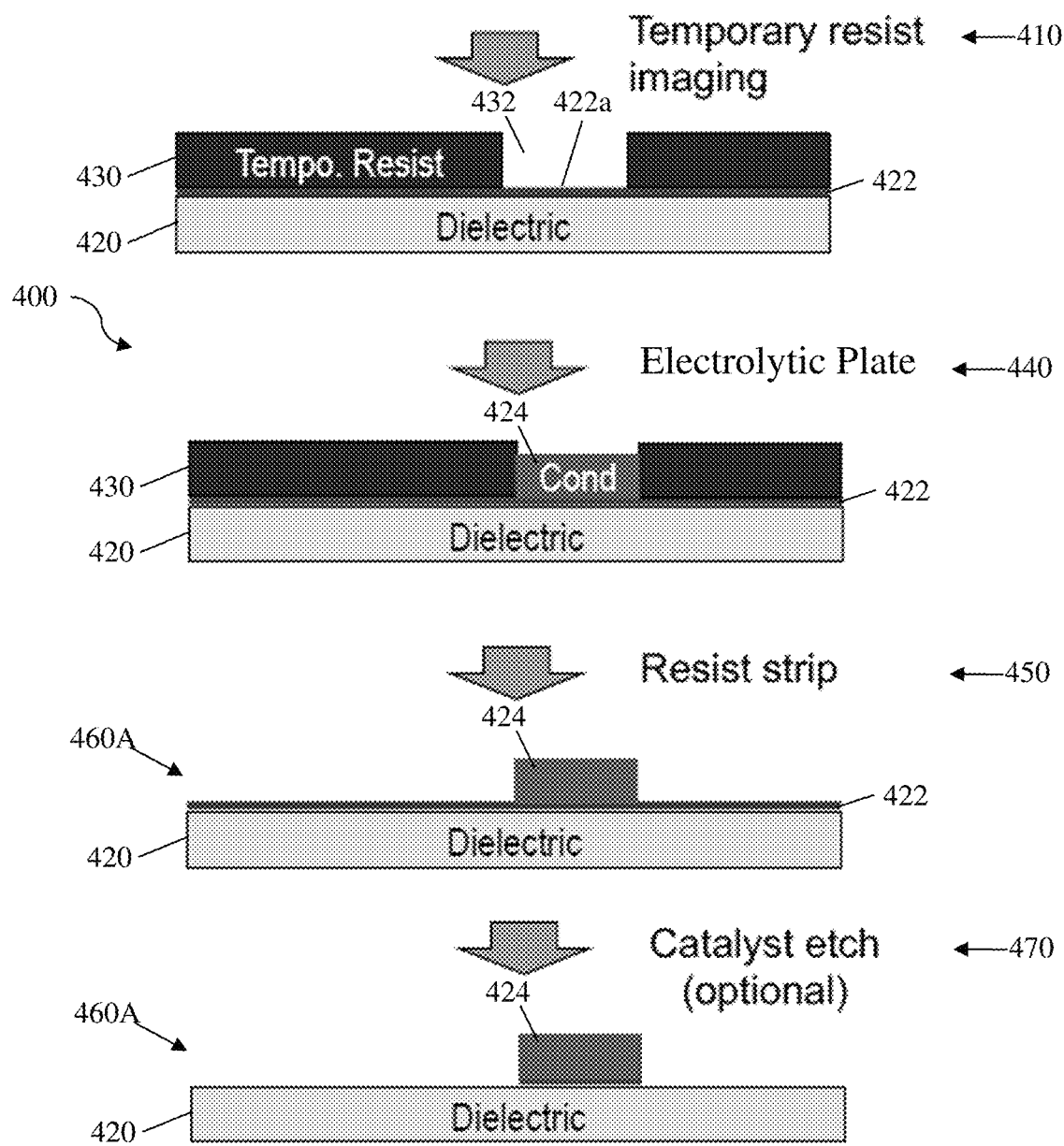
FIG. 4A depicts steps of another method of the inventive subject matter.

FIG. 4A depicts method 400 for manufacturing partial circuit 460A using catalyzed substrate 310 of FIG. 3A. In step 410, temporary resist layer 430 is formed across catalyst 422, deposited on substrate 420 (e.g., dielectric substrate). Temporary resist layer 430 is formed leaving negative pattern 432 in the form of a partial circuit, which exposes portion 422a of catalyst 422. In step 440, conductor 424 is electrolytically plated to exposed portion 422a of catalyst 422, with temporary resist layer 430 preventing electrolytically plating to any portion of catalyst 422 covered by layer 430. In step 450, temporary resist layer 430 is stripped (e.g., chemically stripped) from catalyst 422, exposing catalyst 422 and leaving conductor 424 plated to portion 422a and substrate 420, and forming partial circuit 460A. In optional step 470, catalyst 422 is further removed (e.g., etched, etc.) from substrate 420, yielding partial circuit 460A.

Figure 4B:
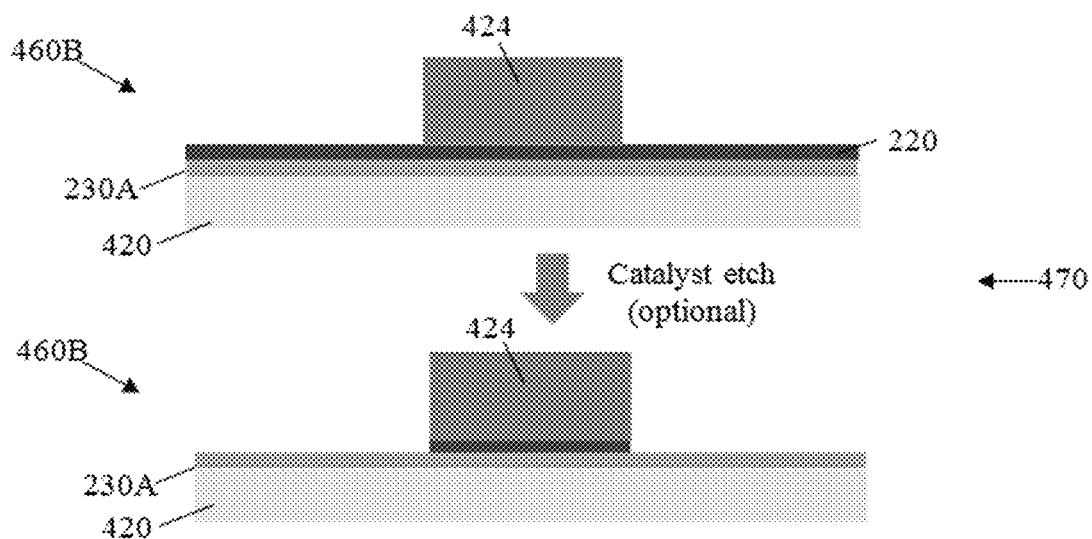
FIGS. 4B to 4D depict further steps in the method of FIG. 4A.
Figure 4C:
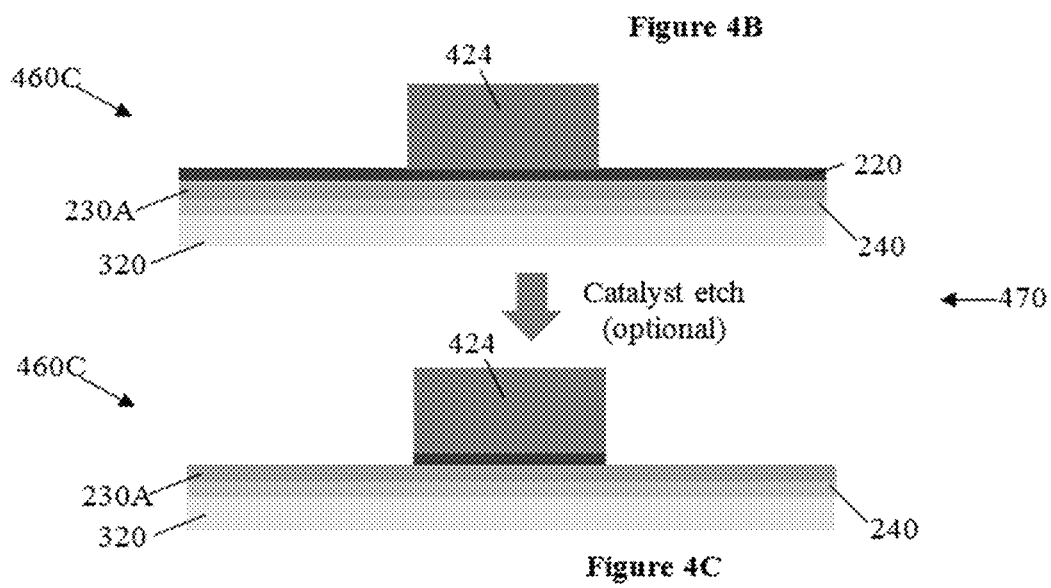
Figure 4D:
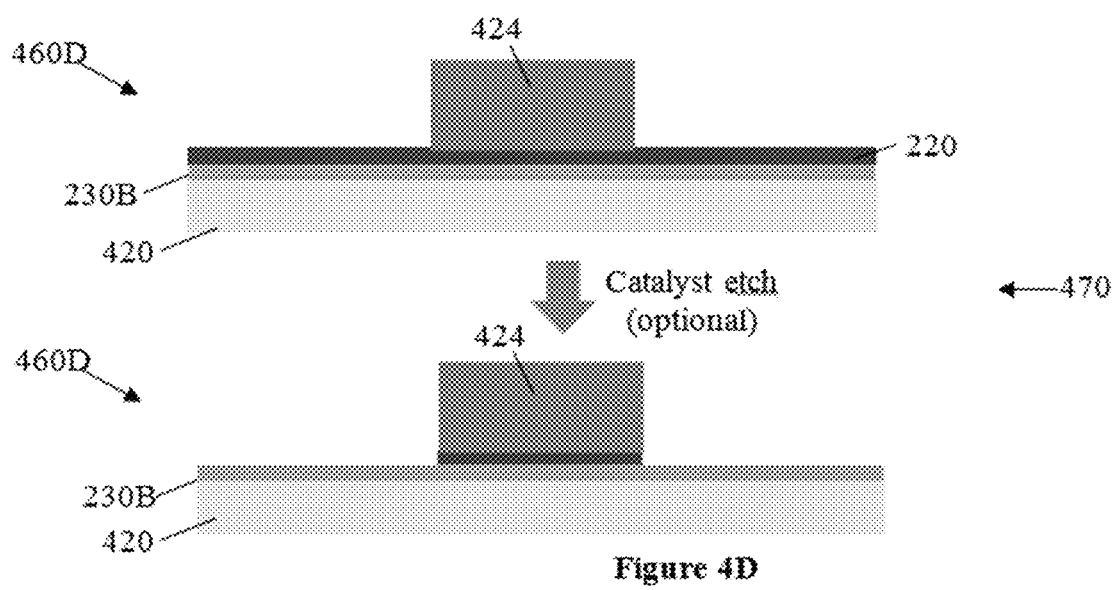

In some embodiments, catalyzed metal foil 200A can be used in place of catalyzed metal foil 310, for example including optional layer 230A or further optional layer 240 as described. In such embodiments, partial circuit 460A will appear as partial circuit 460B including optional layer 230A as depicted in FIG. 4B, or partial circuit 460C including optional layer 230A and further optional layer 240 as depicted in FIG. 4C. In the embodiment of FIG. 4D, catalyzed metal foil 200B is used in place of catalyzed metal foil 310, including organic material layer 230B.

Figure 5:
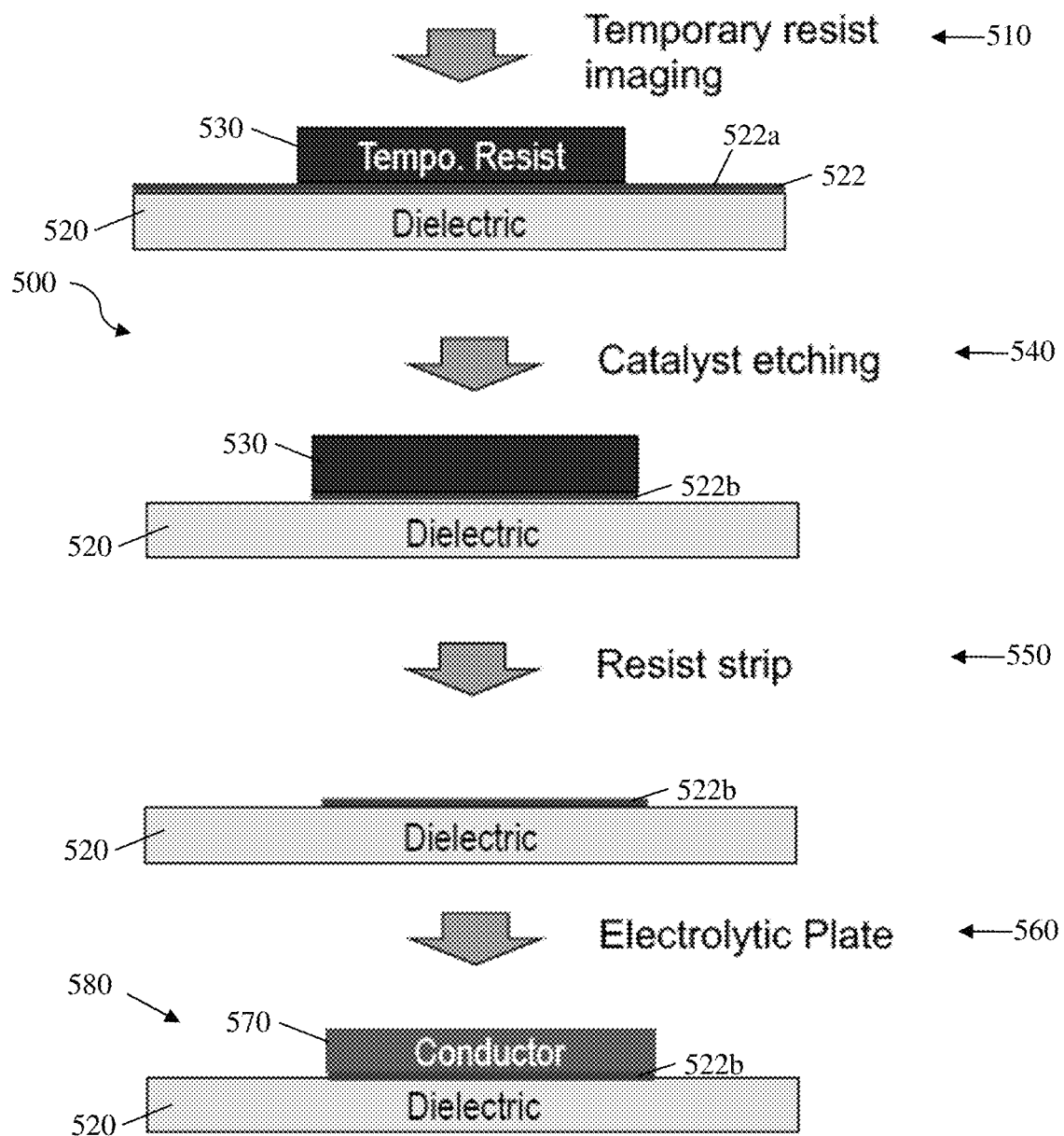
FIG. 5 depicts steps of yet another method of the inventive subject matter.

FIG. 5 depicts method 500 for manufacturing partial circuit 580 using catalyzed substrate 310 of FIG. 3. In step 510, temporary resist layer 530 is formed across catalyst 522, deposited on substrate 520 (e.g., dielectric substrate). Temporary resist layer 530 is formed leaving portions of catalyst 522a exposed, as depicted. In step 540, exposed portions of catalyst 522a are removed (e.g., etched, etc.), leaving only covered portions of catalyst 522b covered by temporary resist layer 530. In step 550, temporary resist layer 530 is stripped, exposing the remaining portion 522b of catalyst. In step 560, conductor 570 is electrolytically plated to catalyst 522b, producing partial circuit 580.

In some embodiments, catalyzed metal foil 200A can be used in place of catalyzed metal foil 310, for example including optional layer 230A or further optional layer 240 as described. In such embodiments, partial circuit 580 will appear as partial circuit 460B including optional layer 230A as depicted in FIG. 4B, or partial circuit 460C including optional layer 230A and further optional layer 240 as depicted in FIG. 4C. In some embodiments, catalyzed metal foil 200B can be used in place of catalyzed metal foil 310. Partial circuit 580 will appear as partial circuit 460D including organic material 230B as depicted in FIG. 4D.

Figure 6:
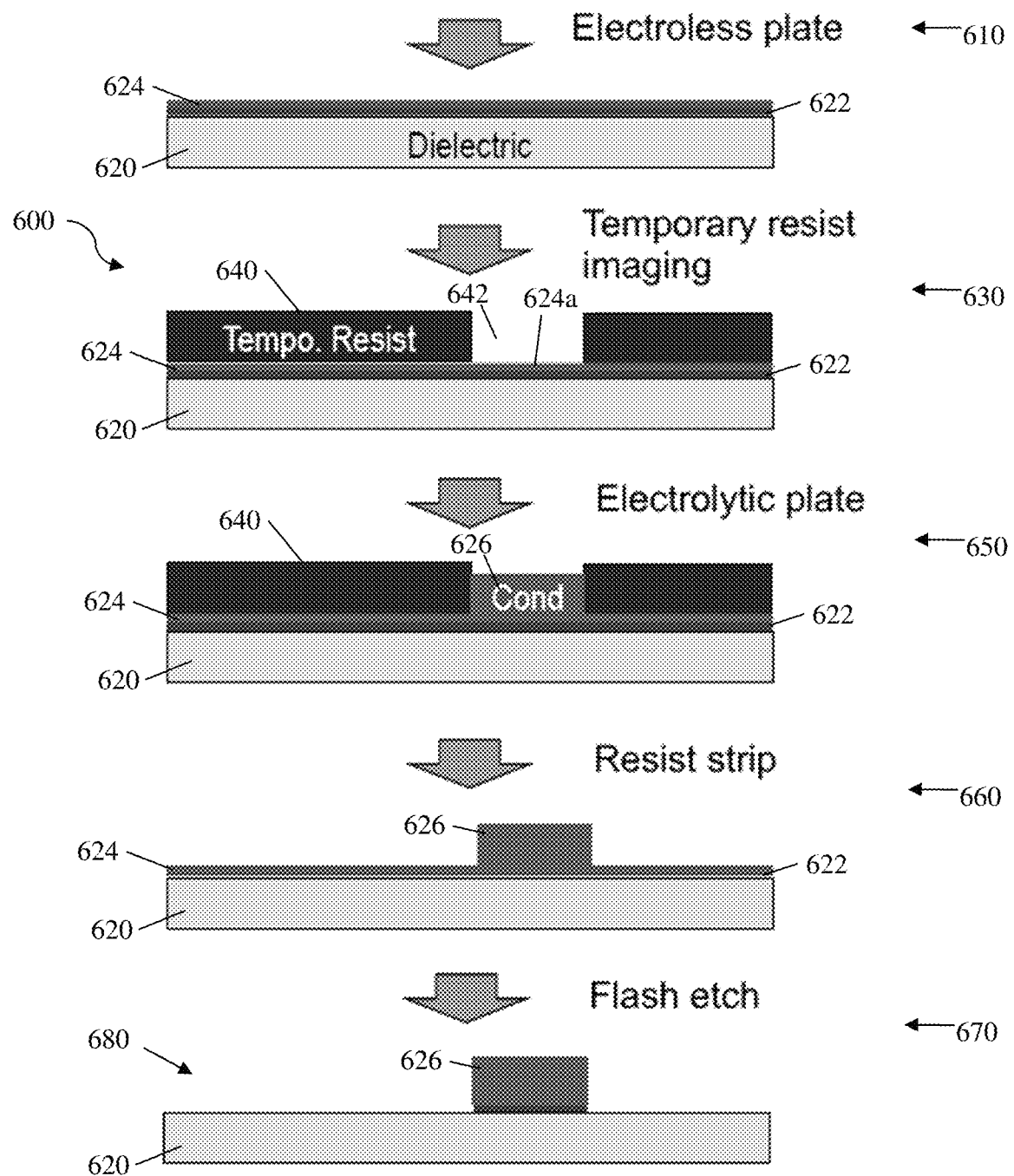
FIG. 6 depicts steps of still another method of the inventive subject matter.

FIG. 6 depicts method 600 for manufacturing partial circuit 680 using catalyzed substrate 310 of FIG. 3. In step 610, conductor 624 is electroless plated to catalyst 622, which is deposited on substrate 620. Conductor 624 is plated typically less than 500 μm, 400 μm, 300 μm, 200 μm, 100 μm, or 50 μm thick, or at least a minimum thickness to propagate electrolytic plating of a conductor. In step 630, temporary resist layer 640 is formed over conductor 624, with negative pattern 642 leaving portion 624a of conductor 624 exposed in the negative pattern of part of a circuit. In step 650, conductor 626 is electrolytically plated to portion 624a of conductor 624. In step 660, temporary resist layer 640 is stripped away, exposing conductor 624. In step 670, exposed portions of conductor 624 and underlying portions of catalyst 622 are removed (e.g., etched, etc.), producing partial circuit 680.

In some embodiments, catalyzed metal foil 200A can be used in place of catalyzed metal foil 310, for example including optional layer 230A or further optional layer 240 as described. In such embodiments, partial circuit 680 will appear as partial circuit 460B including optional layer 230A as depicted in FIG. 4B, or partial circuit 460C including optional layer 230A and further optional layer 240 as depicted in FIG. 4C. In some embodiments, catalyzed metal foil 200B can be used in place of catalyzed metal foil 310. Partial circuit 680 will appear as partial circuit 460D including organic material 230B as depicted in FIG. 4D.

Figure 7A:
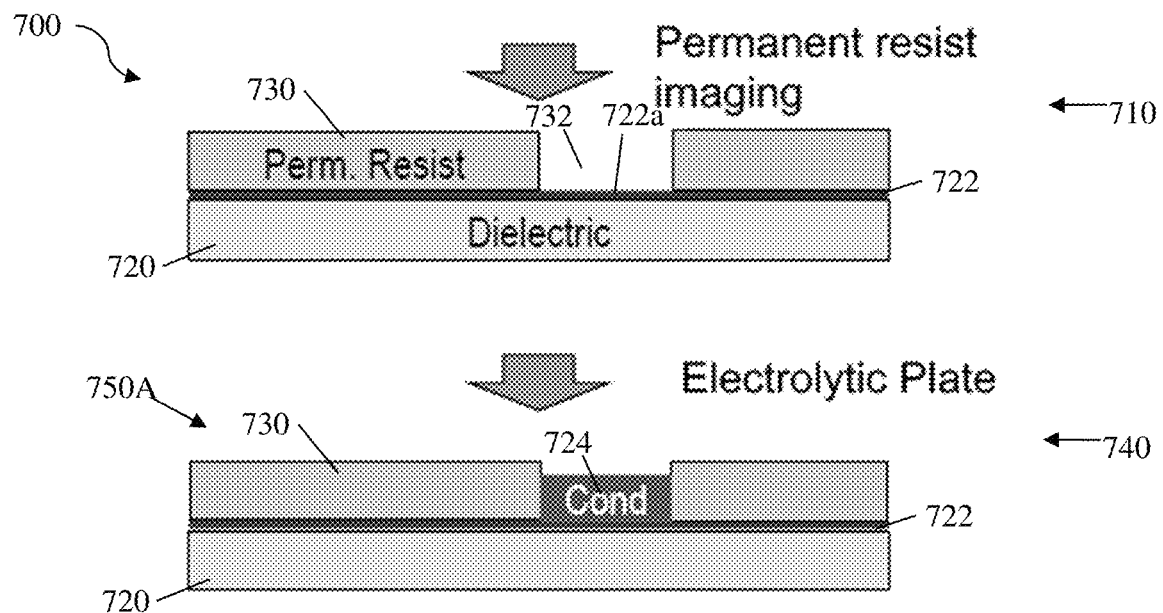
FIG. 7A depicts steps of another method of the inventive subject matter.

FIG. 7A depicts method 700 for manufacturing partial embedded circuit 750A using catalyzed substrate 310 of FIG. 3. In step 710, permanent resist layer 730 is formed over catalyst 722, which is deposited on substrate 720. Permanent resist layer 730 is formed such that negative pattern 732 exposes portion 722a of catalyst 722. In step 740, conductor 724 is electrolytically plated to the exposed portion 722a of catalyst 722, producing partial embedded circuit 750A.

Figure 7B:
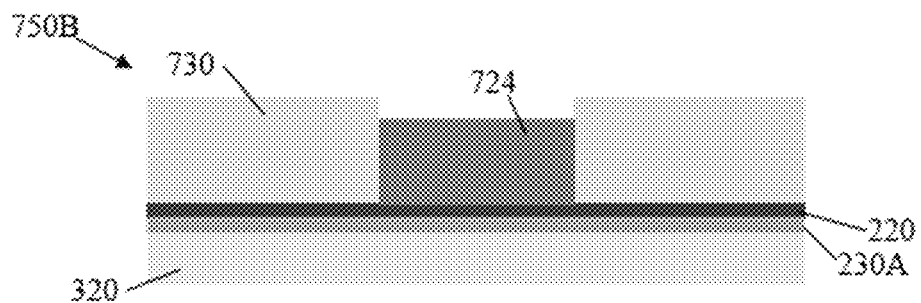
FIGS. 7B to 7D depict further steps in the method of FIG. 7A.
Figure 7C:
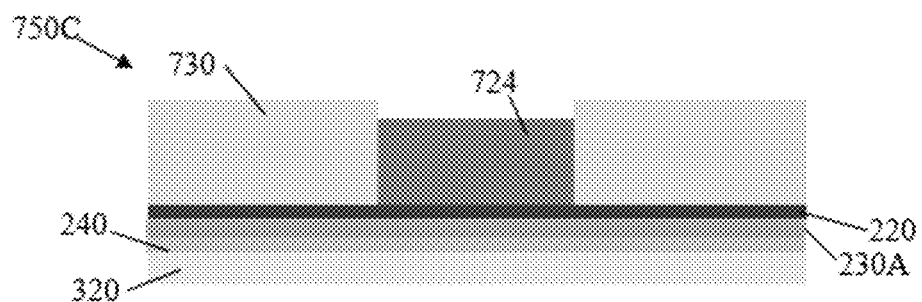
Figure 7D:
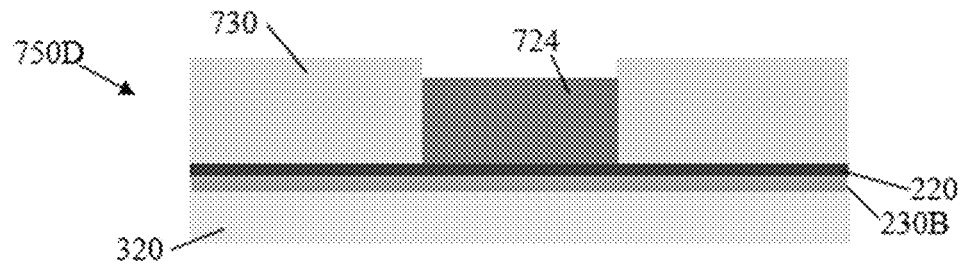

In some embodiments, catalyzed metal foil 200A can be used in place of catalyzed metal foil 310, for example including optional layer 230A or further optional layer 240 as described. In such embodiments, partial circuit 750A will appear as partial circuit 750B including optional layer 230A as depicted in FIG. 7B, or partial circuit 750C including optional layer 230A and further optional layer 240 as depicted in FIG. 7C. In the embodiment of FIG. 7D, catalyzed metal foil 200B is used in place of catalyzed metal foil 310, including organic material layer 230B.

Figure 8:
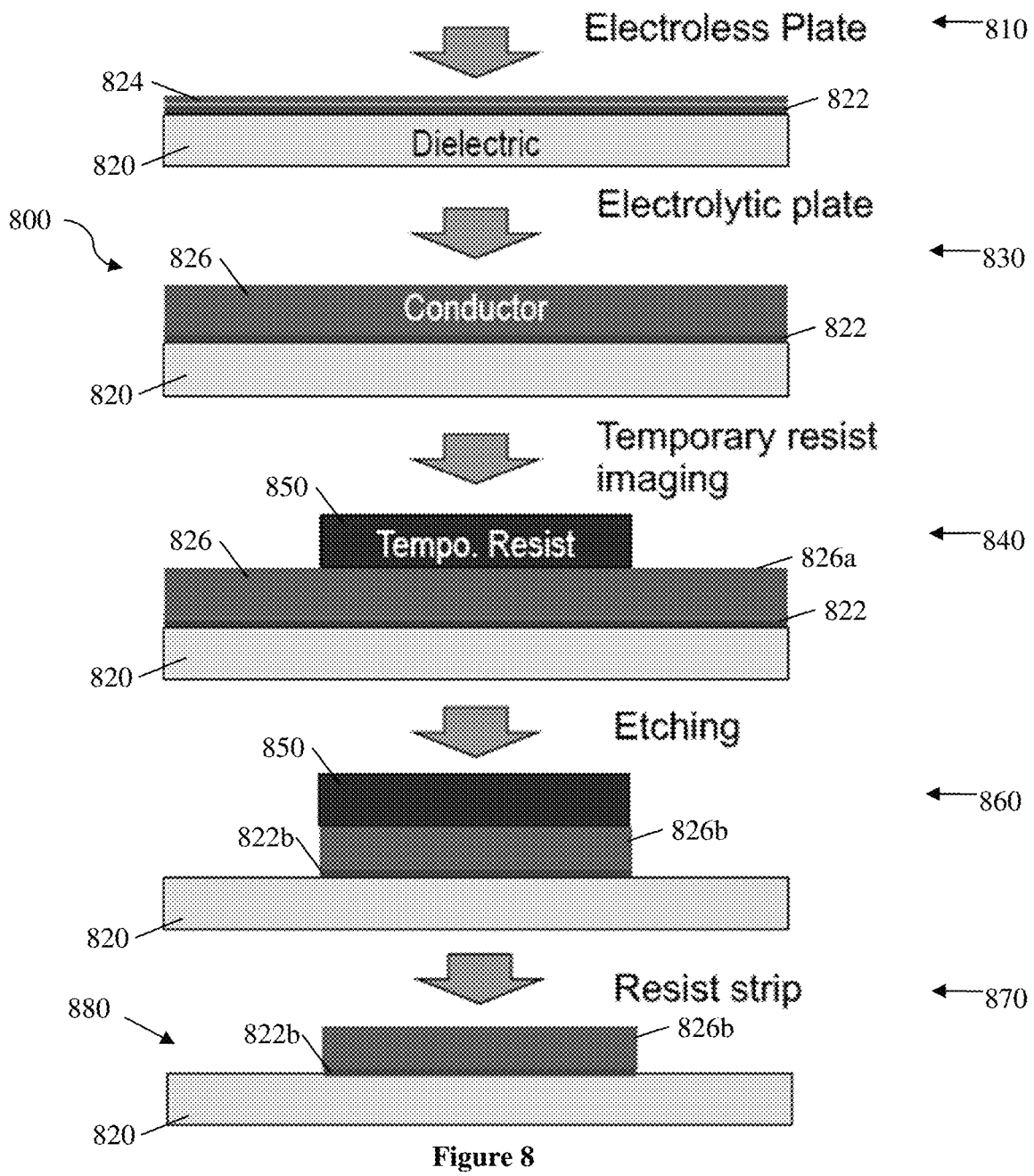
FIG. 8 depicts steps of still another method of the inventive subject matter.

FIG. 8 depicts method 800 for manufacturing partial circuit 880 using catalyzed substrate 310 of FIG. 3. In step 810, conductor 824 is electroless plated to catalyst 822, which is deposited on substrate 820. Conductor 824 is plated typically less than 500 μm, 400 μm, 300 μm, 200 μm, 100 μm, or 50 μm thick, or at least a minimum thickness to propagate electrolytic plating of a conductor. In step 810, conductor 826 is electrolytically plated to conductor 824, typically to a thickness of at least 2×, 3×, 4×, 5×, 6×, 7×, 8×, 9×, 10×, or 20× or more the thickness of conductor 824. In step 840, temporary resist layer 840 is formed on conductor 826 in the pattern of a circuit, leaving exposed portions 826a of conductor 826. In step 860, exposed portions 826a of conductor 826, and portions of catalyst 822 under portions 826a, are removed (e.g., etched, etc.), leaving portions 826b of conductor 826 covered by temporary resist layer 850, and underlying portions 822b of catalyst 822. In step 870, temporary resist layer 850 is stripped, exposing portion 826b of conductor 826 in the pattern of a circuit, producing partial circuit 880.

In some embodiments, catalyzed metal foil 200A can be used in place of catalyzed metal foil 310, for example including optional layer 230A or further optional layer 240 as described. In such embodiments, partial circuit 880 will appear as partial circuit 460B including optional layer 230A as depicted in FIG. 4B, or partial circuit 460C including optional layer 230A and further optional layer 240 as depicted in FIG. 4C. In some embodiments, catalyzed metal foil 200B can be used in place of catalyzed metal foil 310. Partial circuit 880 will appear as partial circuit 460D including organic material 230B as depicted in FIG. 4D.

Figure 9A:
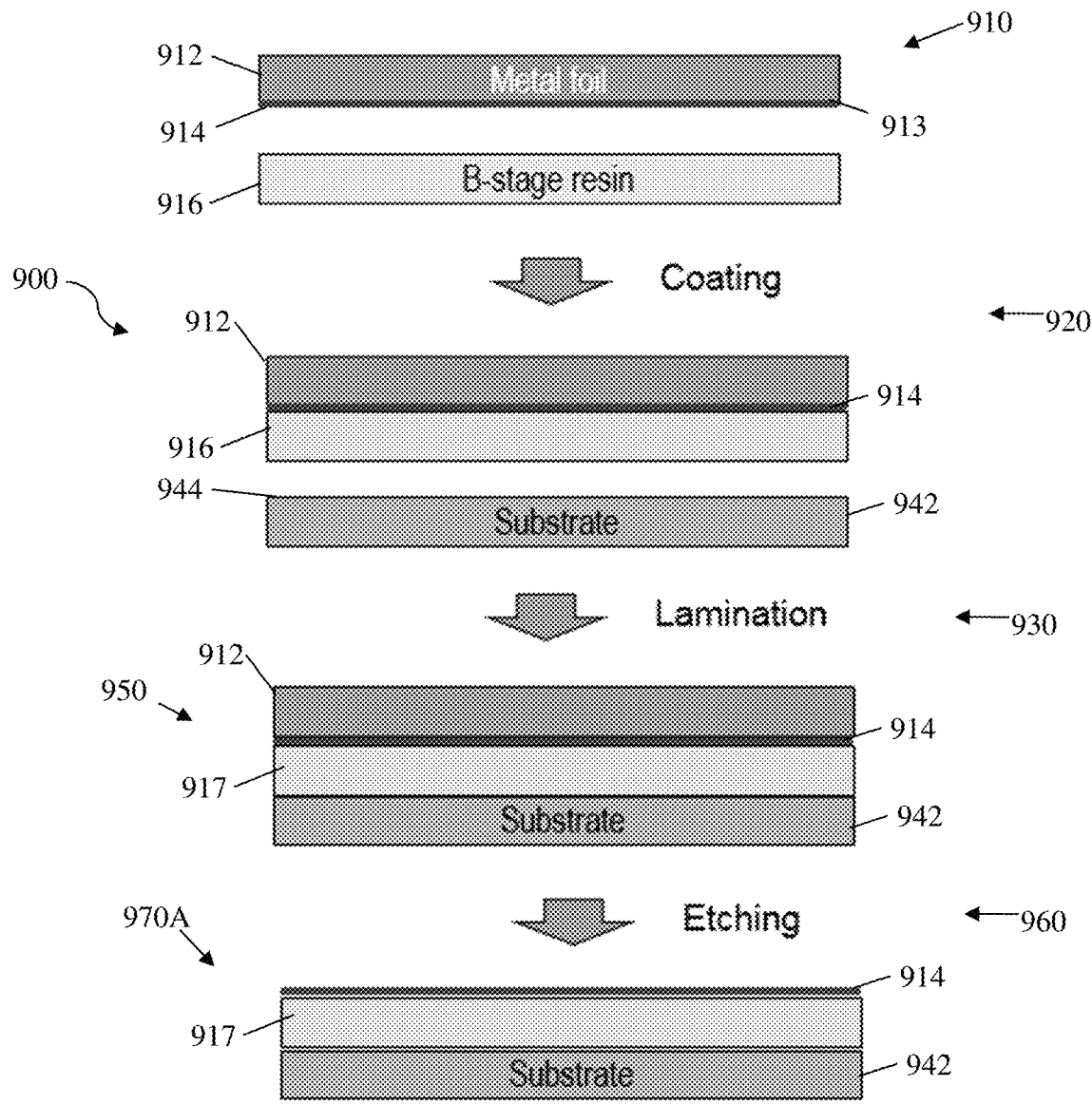
FIG. 9A depicts steps of another method of the inventive subject matter.

FIG. 9A depicts method 900 for manufacturing catalyzed substrate 970A using catalyzed metal foil 910. In step 920, surface 913 (having catalyst 914 deposited on it) of catalyzed metal foil 910 is coated with B-stage resin 916. In step 930, the B-stage resin 916, along with catalyst 914 and metal foil 912, is laminated to surface 944 of substrate 942 (e.g., prepreg, curable film, thermoplastic substrate), producing interim material 950. During the lamination step, B-stage resin 916 is cured to form C-stage resin 917. In step 960, removable metal foil 912 is etched from interim material 950, forming catalyzed substrate 970 having catalyst 914 deposited on cured C-stage resin 917, which is deposited on substrate 942.

While FIG. 9A depicts use of B and C-Stage resins, it is contemplated that other materials or resins can be used. For example, polymers, combinations of polymers, or specifically formulated polymers are used to have beneficial effect, or no effect, on the function or performance of substrate 942. In cases where substrate 942 includes electrical circuitry, polymers that bind or adhere well to the substrate are used, preferably polymers that do not alter performance of the circuitry at all or beyond a desired tolerance. Layer 916 or 917 is preferably thin, less than 100 μm, 50 μm, 20 μm, 10 μm, 5 μm, or less than 0.5 μm. In preferred embodiments a layer of such polymers or resins between 0.5 μm and 0.1 μm thick, but where practical or favorable can be less than 100 nm, less than 50 nm, or less than 10 nm.

Figure 9B:
FIGS. 9B to 9D depict further steps in the method of FIG. 9A.
Figure 9C:
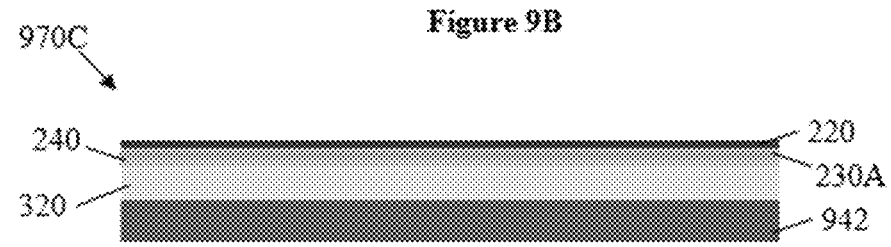
Figure 9D:

In some embodiments, catalyzed metal foil 200A can be used in place of catalyzed metal foil 310, for example including optional layer 230A or further optional layer 240 as described. In such embodiments, catalyzed substrate 970A will appear as catalyzed substrate 970B including optional layer 230A as depicted in FIG. 9B, or catalyzed substrate 970C including optional layer 230A and further optional layer 240 as depicted in FIG. 9C. In the embodiment of FIG. 9D, catalyzed metal foil 200B is used in catalyzed substrate 970D in place of catalyzed metal foil 310, including organic material layer 230B.

Figure 10:
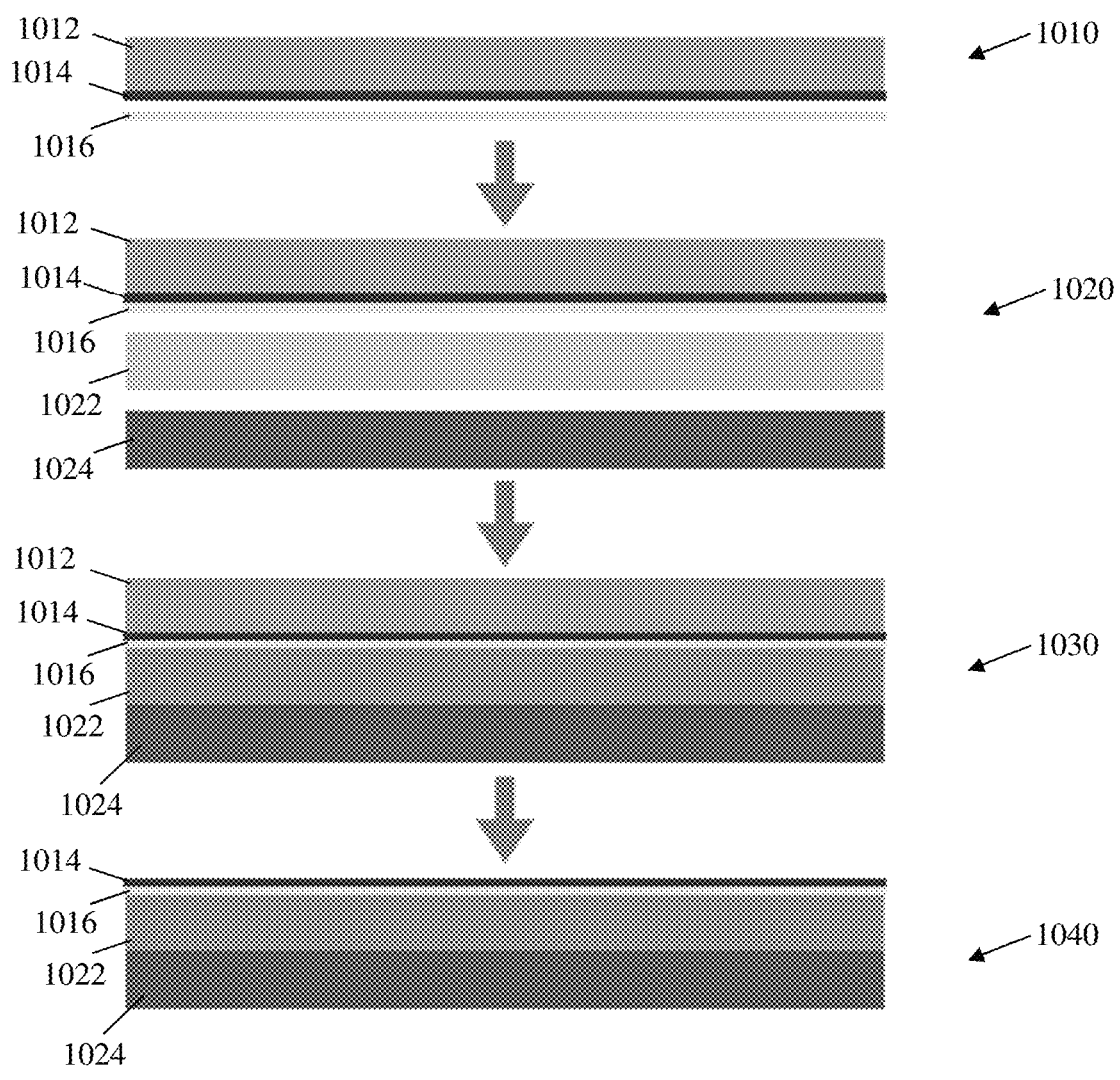
FIG. 10 depicts a flow chart of a process of the inventive subject matter.

FIG. 10 depicts a flow chart of process 1000, which includes starting material 1010, interim material 1020, interim material 1030, and finished material 1040. Starting material 1010 includes removeable material 1012 (e.g., etchable metal, etchable aluminum, etchable copper, removable plastic film, etc.), and catalyst layer 1014 deposited on a surface of removeable metal 1012. Polymer layer 1016 is deposited on a surface of catalyst layer 1014. Preferably, content of polymer layer 1016 is specifically selected, designed, or formulated to bind or adhere favorably to the catalyst layer, to a surface of bonding sheet 1022 (e.g., prepreg, bonding film, adhesive sheet), or both. For example, polymer layer 1016 can include a single polymer variant with high strength or binding specificity to bonding sheet 1022, can include a number of polymer variants with desirable binding or adherence traits, physical tolerance (temperature tolerances, flexibility, durability, etc.), electrical traits (e.g., EM insulation, conductivity, resistivity, dielectric, etc.), or otherwise doped with other materials to imbue polymer layer 1016 with such desirable properties. Further, in preferred embodiments polymer layer 1016 is between 1 µm and 0.01 µm, but where practical or favorable can be less than 500 nm, less than 100 nm, or less than 50 nm. Reducing the separation between catalyst layer 1014 and bonding sheet 1022, or moreover between catalyst layer 1014 and substrate 1024, is absolutely critical in some embodiments.

Interim material 1020 includes removeable metal 1012, catalyst layer 1014, and polymer layer 1016, further including bonding sheet 1022 and substrate 1024. As noted, the contents of polymer layer 1016 are preferably selected to maintain strong binding or adhesion between catalyst layer 1014 and a surface of bonding sheet 1022. Likewise, bonding sheet 1022 is selected to maintain strong binding or adhesion between bonding sheet 1022 and a surface of substrate 1024. In some embodiments, polymer layer 1016 is selected to maintain strong binding or adhesion to a broad class of bonding sheets, bonding sheet 1022 is selected to maintain strong binding or adhesion to a broad class of substrates, or both.

Interim material 1030 includes removeable metal 1012, catalyst layer 1014, polymer layer 1016, bonding sheet 1022, and substrate 1024 adhered or bonded together as depicted (e.g., laminated). Finished material results from removing etchable metal 1012 and exposing a surface of catalyst layer 1014. It is contemplated that finished material 1040 can be further processed to, for example, plate a conductor (electroless, electrolytic, various combinations thereof, etc.) to finished material 1040, in a pattern, in bulk, or both. Such methods are useful for adding electrical transmission lines, circuit patterns, new or improved RF properties or capabilities, or the like to substrate 1024 or finished material 1040A, for example when substrate 1024 already includes electrical circuits or various electronic components with rated, approved, or certified performance tolerances or characteristics.

While FIG. 10 depicts methods and devices for a single sided addition of a catalyst layer or catalyst coated etchable or removable metal layer to a substrate, it is further contemplated that such teachings are applied to add catalyst layer or catalyst coated etchable or removable metal layer to more than one part of a substrate, for example multiple portions of a single side of the substrate, portions of more than one side of the substrate, or multiple portions of multiple sides of the substrate.

Figure 11:
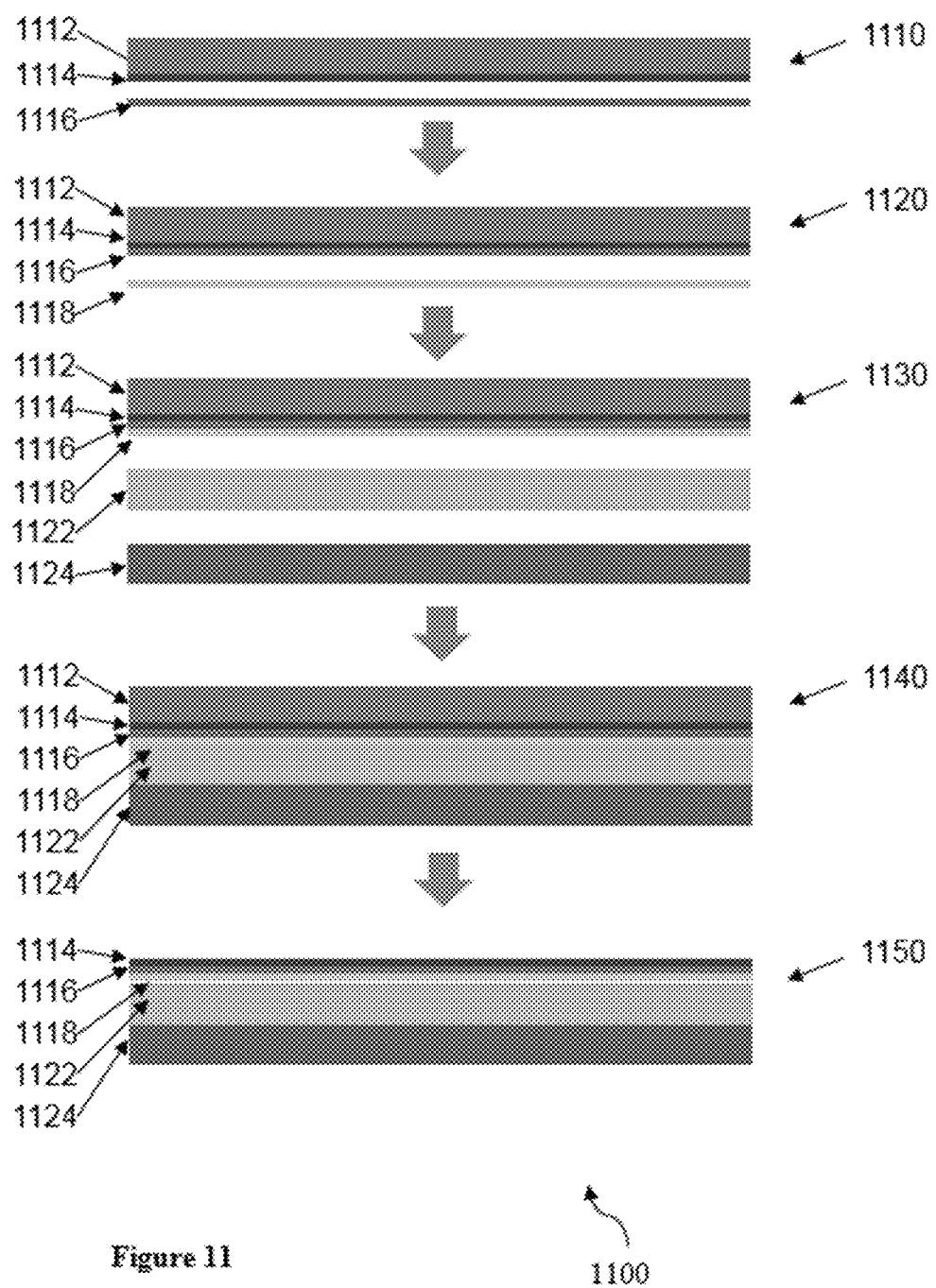
FIG. 11 depicts a flow chart of another process of the inventive subject matter.

FIG. 11 depicts a flow chart of process 1100, which includes starting material 1110, interim material 1120, interim material 1130, interim material 1140, and finished material 1150. Starting material 1110 includes removeable material 1112 (e.g., etchable metal, etchable aluminum, etchable copper, removeable plastic film, etc.), and catalyst layer 1114 deposited on a surface of removeable metal 1112. Metal oxide layer 1116 is deposited on a surface of catalyst layer 1114. Preferably, metal oxide layer 1116 is specifically selected, designed, or formulated to bind or adhere favorably to catalyst layer 1114. Further, metal oxide layer 1116 preferably protects subsequent polymer layer 118 from diffusion and promotes good adhesion of metal oxide layer 1116, and thereby starting materials 1110, to polymer layer 1118.

Interim material 1120 further includes polymer layer 1118, which is deposited on a surface of metal oxide layer 1116. Preferably, content of polymer layer 1118 is specifically selected, designed, or formulated to bind or adhere favorably to catalyst layer 1116, to a surface of bonding sheet 1122 (e.g., prepreg, bonding film, adhesive sheet), to metal oxide layer 1116, or combinations thereof. For example, polymer layer 1118 can include a single polymer variant with high strength or binding specificity to bonding sheet 1122, can include a number of polymer variants with desirable binding or adherence traits, physical tolerance (temperature tolerances, flexibility, durability, etc.), or electrical traits (e.g., EM insulation, conductivity, resistivity, dielectric, etc.), or otherwise doped with other materials to imbue polymer layer 1118 with such desirable properties. Further, in preferred embodiments the combined thickness of metal oxide layer 1116 and polymer layer 1118 is between 1.0p m and 0.01 µm, but where practical or favorable can be less than 500 nm, less than 100 nm, or less than 50 nm. Reducing the separation between catalyst layer 1114 and bonding sheet 1122, or moreover between catalyst layer 1114 and substrate 1124, is absolutely critical in some embodiments.

Interim material 1130 includes removeable metal 1112, catalyst layer 1114, metal oxide layer 1116, and polymer layer 1118, further including bonding sheet 1122 and substrate 1124. As noted, the contents of polymer layer 1118 are preferably selected to maintain strong binding or adhesion between metal oxide layer 1116 (thereby catalyst layer 1114 and removable metal 1112) and a surface of bonding sheet 1122. Likewise, bonding sheet 1122 is selected to maintain strong binding or adhesion between bonding sheet 1122 and a surface of substrate 1124. In some embodiments, polymer layer 1118 is selected to maintain strong binding or adhesion to a broad class of bonding sheets, bonding sheet 1122 is selected to maintain strong binding or adhesion to a broad class of substrates, or both.

Interim material 1140 includes removeable metal 1112, catalyst layer 1114, metal oxide layer 1116, polymer layer 1118, bonding sheet 1122, and substrate 1124 adhered or bonded together as depicted (e.g., laminated). Finished material 1150 results from removing removeable metal 1112 and exposing a surface of catalyst layer 1114. It is contemplated that finished material 1140 can be further processed to, for example, plate a conductor (electroless, electrolytic, various combinations thereof, etc.) to finished material 1150, in a pattern, in bulk, or both. Such methods are useful for adding electrical transmission lines, circuit patterns, new or improved RF properties or capabilities, or the like to substrate 1124 or finished material 1150, for example when substrate 1124 already includes electrical circuits or various electronic components with rated, approved, or certified performance tolerances or characteristics.

While FIG. 11 depicts methods and devices for a single sided addition of a catalyst layer or catalyst coated or removable metal layer to a substrate, it is further contemplated that such teachings are applied to add catalyst layer or catalyst coated or removable metal layer to more than one part of a substrate, for example multiple portions of a single side of the substrate, portions of more than one side of the substrate, or multiple portions of multiple sides of the substrate.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of forming an electrical circuit using a metal foil having a surface bearing a catalyst material, the method comprising:
    applying a layer of an organic material to the catalyst material,
        and subsequently applying the surface of the metal foil bearing the catalyst material to a surface of a substrate, wherein the surface of the metal foil is roughened by etching;
    laminating the metal foil to the substrate;
    etching the metal foil, thereby exposing the catalyst material; and
    electroless metal plating a first conductor to the exposed catalyst material;
    wherein the metal foil is removable; and
    wherein the organic material is a copolymer comprising an alkaline-reactive polymer and an alkaline-non-reactive polymer, and at least one of (i) the copolymer has a functional group with a lone pair electron, (ii) the functional group comprises one of nitrogen or sulfur, (iii) the alkaline-reactive polymer comprises at least one of a polyimide, an amide, an ester, or a thioester, or (iv) the ratio of the alkaline-reactive polymer to the alkaline-non-reactive polymer is between 5%:95% and 95%:5% by molecular weight, respectively.

2. The method of claim 1, wherein the catalyst material is reduced to a catalyst either before the step of applying the surface of the metal foil to the surface of the substrate or after the step of etching the metal foil.

3. The method of claim 1, further comprising at least one of the steps of:
    (i) applying a plating resist in a negative circuit pattern onto the exposed catalyst material before the step of electroless metal plating and removing the plating resist after the step of electroless metal plating;
    (ii) before the step of electroless metal plating applying an etching resist in a positive circuit pattern onto the exposed catalyst material, etching catalyst material not covered by the etching resist, and removing the etching resist;
    (iii) applying a plating resist over the first conductor in a negative circuit pattern, electrolytically depositing a second conductor to exposed portions of the first conductor, removing the plating resist, and removing portions of the first conductor not covered by the second conductor;

(iv) applying a permanent plating resist in a negative circuit pattern onto the exposed catalyst material, before the step of electroless metal plating.

4. The method of claim 1, further comprising the following steps, after the step of electroless plating:
electrolytically depositing a second conductor to the first conductor;
applying an etching resist over the second conductor in a positive circuit pattern;
etching the first and second conductor not covered by the etching resist; and
removing the etching resist.

5. The method of claim 1, wherein the metal foil is selected from the group consisting of aluminum, anodized aluminum, copper, tin, and alloys thereof.

6. The method of claim 1, further comprising one of the steps of (i) applying an adhesive layer between the surface of the metal foil bearing the catalyst material and the surface of the substrate or (ii) applying a polymer layer over a surface of the catalyst material and binding the polymer layer with the substrate via a bonding sheet.

7. The method of claim 1, further comprising the step of applying a layer of a pre-ceramic polymer, a ceramic, a composite of metal oxides, a polymer, an oxidized metal particle, a nitride, or a boride over a surface of the catalyst material.

8. The method of claim 6, further comprising the step of applying a metal oxide layer over a surface of the catalyst material before the step of applying the polymer layer.

9. The method of claim 1, wherein the organic material is selected to (i) protect the catalyst material layer from diffusion of the catalyst material, (ii) improve bonding strength of the catalyst material to a substrate, or (iii) absorb mechanical stress between the catalyst layer and a substrate due to temperature change.

10. A method of forming an electrical circuit using a metal foil having a surface bearing a catalyst material, the method comprising:
depositing a coating layer to the surface of the metal foil bearing the catalyst material, wherein the coating layer comprises an organic material the organic material is a copolymer comprising an alkaline-reactive polymer and an alkaline-non-reactive polymer;
the surface of the metal foil is roughened;
applying the surface of the metal foil bearing the catalyst material and the coating layer to a surface of a substrate;
laminating the metal foil to the substrate;
etching the metal foil, thereby exposing the catalyst material; and
electroless metal plating a first conductor to the exposed catalyst material; wherein the metal foil is removable, and at least one of (i) the surface of the metal foil is roughened by etching, (ii) the copolymer has a functional group with a lone pair electron, (iii) the functional group comprises one of nitrogen or sulfur, (iv) the alkaline-reactive polymer comprises at least one of a polyimide, an amide, an ester, or a thioester, or (vi) the ratio of the alkaline-reactive polymer to the alkaline-non-reactive polymer is between 5%:95% and 95%:5% by molecular weight, respectively.

11. The method of claim 10, wherein the catalyst material is reduced to a catalyst either before the step of applying the surface of the metal foil to the surface of the substrate or after the step of etching the metal foil.

12. The method of claim 10, wherein at least one of (i) the metal foil is selected from the group consisting of aluminum, anodized aluminum, copper, tin, and alloys thereof, (ii) the coating layer comprises a polymer, (iii) the coating layer is no more than 500 µm thick, or (iv) the coating layer comprises a pre-ceramic polymer, a ceramic or a composite of metal oxide, polymer, oxidized metal particle, nitride, or boride.

13. The method of claim 10, further comprising at least one of the steps of (i) applying an adhesive layer between the surface of the metal foil bearing the catalyst material to the surface of the substrate, or (ii) coating the coating layer with a polymer layer.

14. The method of claim 10, wherein the step of laminating the metal foil to the substrate comprises laminating the coating layer to a bonding sheet.

* * * * *